United States Patent
Chao

(10) Patent No.: US 8,624,273 B2
(45) Date of Patent: *Jan. 7, 2014

(54) CIRCUIT STRUCTURE OF PACKAGE CARRIER AND MULTI-CHIP PACKAGE

(75) Inventor: Tzu-Hao Chao, New Taipei (TW)

(73) Assignee: Everlight Electronics Co., Ltd. (TW)

( * ) Notice: Subject to any disclaimer, the term of this patent is extended or adjusted under 35 U.S.C. 154(b) by 234 days.

This patent is subject to a terminal disclaimer.

(21) Appl. No.: 13/118,575

(22) Filed: May 31, 2011

(65) Prior Publication Data

US 2011/0254024 A1 Oct. 20, 2011

Related U.S. Application Data

(63) Continuation of application No. 12/621,529, filed on Nov. 19, 2009, now Pat. No. 8,071,989.

(30) Foreign Application Priority Data

Nov. 20, 2008 (TW) ............................... 97144960 A

(51) Int. Cl.
*H01L 29/205* (2006.01)
(52) U.S. Cl.
USPC ..................................... 257/89; 257/E33.002
(58) Field of Classification Search
USPC .............................. 257/89, E27.121, E33.002
See application file for complete search history.

(56) References Cited

U.S. PATENT DOCUMENTS

| | | |
|---|---|---|
| 4,600,970 A | 7/1986 | Bauer |
| 2005/0006734 A1 | 1/2005 | Harun et al. |
| 2006/0220200 A1 | 10/2006 | Yang |
| 2007/0257341 A1 | 11/2007 | Lee et al. |
| 2008/0001908 A1 | 1/2008 | Wen et al. |
| 2008/0191222 A1 | 8/2008 | Lee |

FOREIGN PATENT DOCUMENTS

| | | |
|---|---|---|
| KR | WO 2007055457 | 5/2007 |
| WO | WO 2007055457 A1 * | 5/2007 |

* cited by examiner

*Primary Examiner* — Thomas L Dickey
(74) *Attorney, Agent, or Firm* — Han IP Corporation

(57) ABSTRACT

A multi-chip package comprises a plurality of chip pads and a plurality of LED chips. The chip pads are arranged in an M×N array, M and N each a positive integer greater than 1. A peripheral area of each chip pad comprises a respective first bonding pad, a respective second bonding pad, and a respective third bonding pad arranged in sequence in a clockwise direction. A first orientation of the respective first to third bonding pads in a first row of the N rows differs from a second orientation of the respective first to third bonding pads in a second row of the N rows by 90 degrees. Each of the LED chips is disposed on a respective one of the chip pads and electrically connected to two of the respective first to third bonding pads on a same side of the respective LED chip.

20 Claims, 3 Drawing Sheets

CIRCUIT STRUCTURE OF PACKAGE CARRIER AND MULTI-CHIP PACKAGE

CROSS-REFERENCE TO RELATED PATENT APPLICATIONS

This application is a continuation of U.S. patent application Ser. No. 12/621,529, filed Nov. 19, 2009, which claims the priority benefit of Taiwan Patent Application Number 097144960, filed Nov. 20, 2008, which applications are herein incorporated in their entirety by reference.

BACKGROUND

1. Technical Field

The present disclosure relates to a circuit structure of a package carrier and a multi-chip package having the circuit structure, and more particularly, to a circuit structure suitable for carrying a plurality of wire bonding light emitting diode (LED) chips and a multi-chip package having the circuit structure.

2. Description of Related Art

The advanced countries in the world are all currently devoting time and effort to the development of opto-electronic material industry. The LED has longevity and low power consumption and thus application thereof is becoming popular. The LED can be used in applications such as large electronic billboard, traffic lights, turn signals of vehicles, and illumination. The current LED industry is advancing toward the goal of high brightness and low light loss so that the LED is able to replace conventional illumination means.

However, to increase the brightness of the LED and to decrease the light loss thereof, the package method of the LED is a key factor influencing the brightness, uniformity of illumination, and element lifespan of the LED in addition to improving the structure of the LED itself. In the conventional technology, a plurality of LED chips is packaged on a same substrate by means of a multi-chip packaging method to form a multi-chip package. Therefore, the multi-chip package including a plurality of LED chips has more diversified brightness and color. The plurality of LED chips in the multi-chip package may be electrically connected in parallel, in series, or in series-parallel.

In the conventional technology, a plurality of chip pads in the multi-chip package are arranged in arrays and a plurality of bonding pads respectively connected to different electrodes are disposed in a peripheral area of each of the LED chips. The orientations of the bonding pads in the peripheral area of each chip pad are the same. Each of the LED chips is disposed on each of the chip pads and is respectively electrically connected to the different bonding pads in the peripheral area of each of the chip pads through a first conductive line and a second conductive line so that the LED chips are connected to each other in parallel, in series, or in series-parallel.

When the LED chips in the multi-chip package are electrically connected in series or in series-parallel, one of the LED chips may be respectively electrically connected to a first bonding pad and a second bonding pad in the peripheral area of the LED chip through the first conductive line and the second conductive line. Another LED chip may be respectively electrically connected to the second bonding pad and a third bonding pad in the peripheral area of the LED chip through the first conductive line and the second conductive line. Therefore, the wire bonding directions of the mentioned two LED chips are different.

However, in the manufacturing process of wire bonding, changing the wire bonding direction decreases the speed and yield of wire bonding and thereby causes low productivity and high costs. Hence, how to enable LED chips to be electrically connected in series or in series-parallel without changing wire bonding direction is currently an issue to be resolved.

SUMMARY

The present disclosure provides a circuit structure of a package carrier in which wire bonding direction does not need to be changed in a subsequent wire bonding process.

The present disclosure further provides a multi-chip package for which wire bonding direction does not need to be changed in the manufacturing process so that the speed and yield of the wire bonding process are increased.

In one aspect, a circuit structure of a package carrier that carries a plurality of wire bonding LED chips is provided. The circuit structure may comprise a plurality of chip pads, and a first electrode, a second electrode, and a third electrode. The chip pads may be arranged in an array of M columns and N rows to dispose the LED chips, M and N each being a positive integer greater than 1. For each of the chip pads, the circuit structure may also comprise a respective first bonding pad, a respective second bonding pad, and a respective third bonding pad that are electrically insulated from each other and sequentially arranged in a peripheral area of the respective chip pad. A first orientation of the respective first, second, and third bonding pads in a first row of the N rows may differ from a second orientation of the respective first, second, and third bonding pads in a second row of the N rows by 90 degrees. The first electrode may comprise a plurality of first branch lines connected to the respective M first bonding pads in each of the N rows. The second electrode may comprise a plurality of second branch lines connected to the respective M second bonding pads in each of the N rows. The third electrode may comprise a plurality of third branch lines connected to the respective M third bonding pads in each of the N rows.

In one embodiment, the second orientation may differ from the first orientation by 90 degrees counterclockwise. Additionally, a third orientation of the respective first, second, and third bonding pads in a third row of the N rows may differ from the second orientation by 90 degrees counterclockwise, the second row being between the first row and the third row.

In one embodiment, the first electrode may have a first main body portion, the second electrode may have a second main body portion, and the third electrode may have a third main body portion. The first, second, and third main body portions may be sequentially arranged in a peripheral area of the array of the chip pads.

In one embodiment, the first main body portion may be connected to the respective M first bonding pads in each of the N rows via the first branch lines.

In one embodiment, the second main body portion may be connected to the respective M second bonding pads in each of the N rows via the second branch lines.

In one embodiment, the third main body portion may be connected to the respective M third bonding pads in each of the N rows via the third branch lines.

In one embodiment, the first branch lines and the second branch lines may be alternately arranged.

In one embodiment, for each of the chip pads, the circuit structure may further comprise a respective fourth bonding pad that is electrically insulated from the respective first, second, and third bonding pads. A fourth orientation of the respective first, second, third, and fourth bonding pads in a first row of the N rows may differ from a fifth orientation of the respective first, second, third, and fourth bonding pads in a second row of the N rows by 90 degrees. The circuit structure may additionally comprise a fourth electrode that comprises a plurality of fourth branch lines connected to the respective M fourth bonding pads in each of the N rows.

In another aspect, a multi-chip package may comprise a plurality of chip pads and a plurality of LED chips. The plurality of chip pads may be arranged in an M×N array, M and N each being a positive integer greater than 1. A peripheral area of each of the chip pads may comprise a respective first bonding pad, a respective second bonding pad, and a respective third bonding pad arranged in sequence in a clockwise direction. A first orientation of the respective first, second, and third bonding pads in a first row of the N rows may differ from a second orientation of the respective first, second, and third bonding pads in a second row of the N rows by 90 degrees. Each LED chip may be disposed on a respective one of the chip pads and electrically connected to two of the respective first, second, and third bonding pads on a same side of the respective LED chip.

In one embodiment, the multi-chip package may further comprise a first electrode, a second electrode, and a third electrode. The first electrode may comprise a plurality of first branch lines connected to the respective M first bonding pads in each of the N rows. The second electrode may comprise a plurality of second branch lines connected to the respective M second bonding pads in each of the N rows. The third electrode may comprise a plurality of third branch lines connected to the respective M third bonding pads in each of the N rows. The first electrode may have a first main body portion, the second electrode may have a second main body portion, and the third electrode may have a third main body portion. The first, second, and third main body portions may be sequentially arranged in a peripheral area of the array of the chip pads.

In one embodiment, the multi-chip package may further comprise a substrate on which the chip pads are disposed. The substrate may include an insulation layer. The first electrode, the second electrode, and the first to fourth bonding pads may be disposed on the insulation layer. The third electrode may be disposed under the insulation layer and may pass through the insulation layer to connect to the third bonding pad.

Additionally, the multi-chip package may comprise a plurality of first conductive lines and a plurality of second conductive lines. Each of the first conductive lines and each of the second conductive lines may be electrically connected to a respective one of the LED chips and two of the respective first, second, and third bonding pads on a same side of the respective one of the LED chips. The first conductive lines in each pair and the second conductive lines in each pair may be respectively electrically connected to the respective one of the LED chips and two of the bonding pads on a same side of each LED chip.

Additionally, the multi-chip package may further comprise a coating layer disposed on the insulation layer and covering the first, second, and third bonding pads. The coating layer may have a plurality of openings that expose the LED chips and portions of the first, second, and third bonding pads in the peripheral area of each LED chip. The portions of the first, second, and third bonding pads may be adjacent to each LED chip. The coating layer may comprise resin.

In one embodiment, the second orientation may differ from the first orientation by 90 degrees counterclockwise. A third orientation of the respective first, second, and third bonding pads in a third row of the N rows may differ from the second orientation by 90 degrees counterclockwise, where the second row is between the first row and the third row.

In one embodiment, the multi-chip package may further comprise a fourth electrode that comprises a plurality of fourth branch lines connected to the respective M fourth bonding pads in each of the N rows. Additionally, the peripheral area of each of the chip pads may further comprise a respective fourth bonding pad that is electrically insulated from the respective first, second, and third bonding pads. A fourth orientation of the respective first, second, third, and fourth bonding pads in a first row of the N rows may differ from a fifth orientation of the respective first, second, third, and fourth bonding pads in a second row of the N rows by 90 degrees.

In light of the above illustration, the orientations of each of the first to third bonding pads in the Sth row are different from the orientations of each of the first to third bonding pads in the (S−1)th row by a quadrant (90 degrees). Therefore, the first conductive line and the second conductive line may respectively be electrically connected to two bonding pads on a same side of each LED chip. As such, in the present disclosure, the direction of wire bonding does not need to be changed when fabricating the first and second conductive lines.

In order to make the above and other objects, features and advantages of the present disclosure more comprehensible, several embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF PREFERRED EMBODIMENTS

Figure 1A:
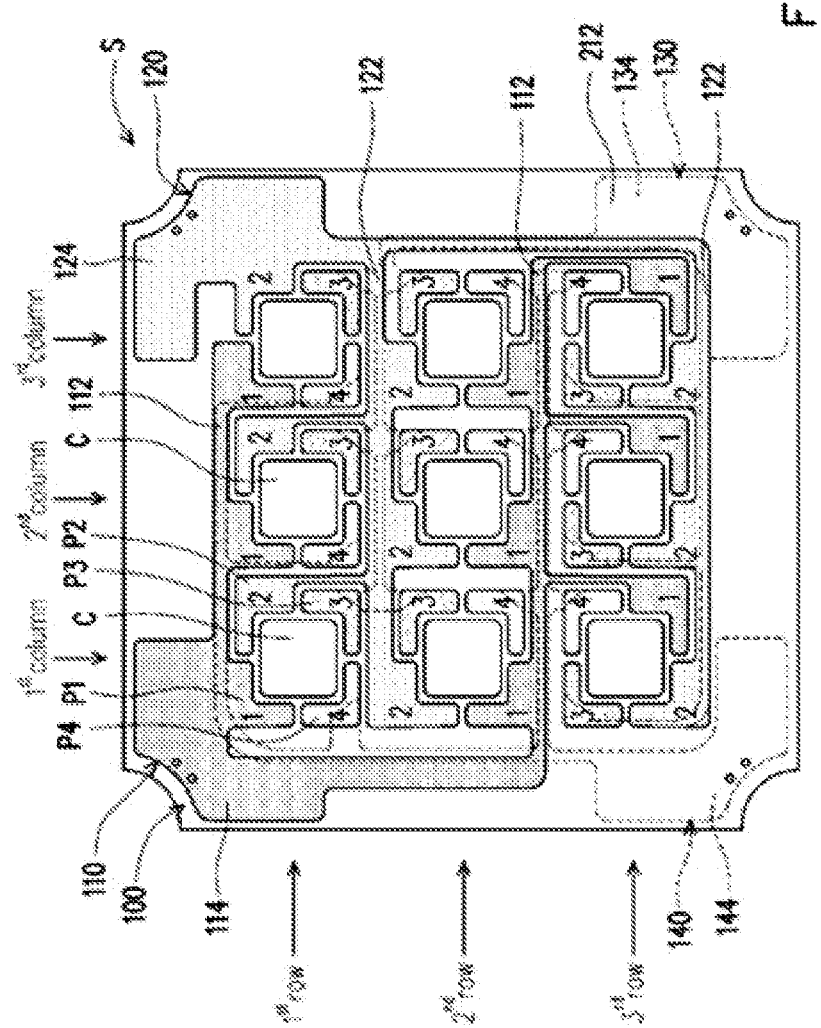
FIG. 1A is a schematic view illustrating a circuit structure of a package carrier according to one embodiment of the present disclosure.
Figure 1B:
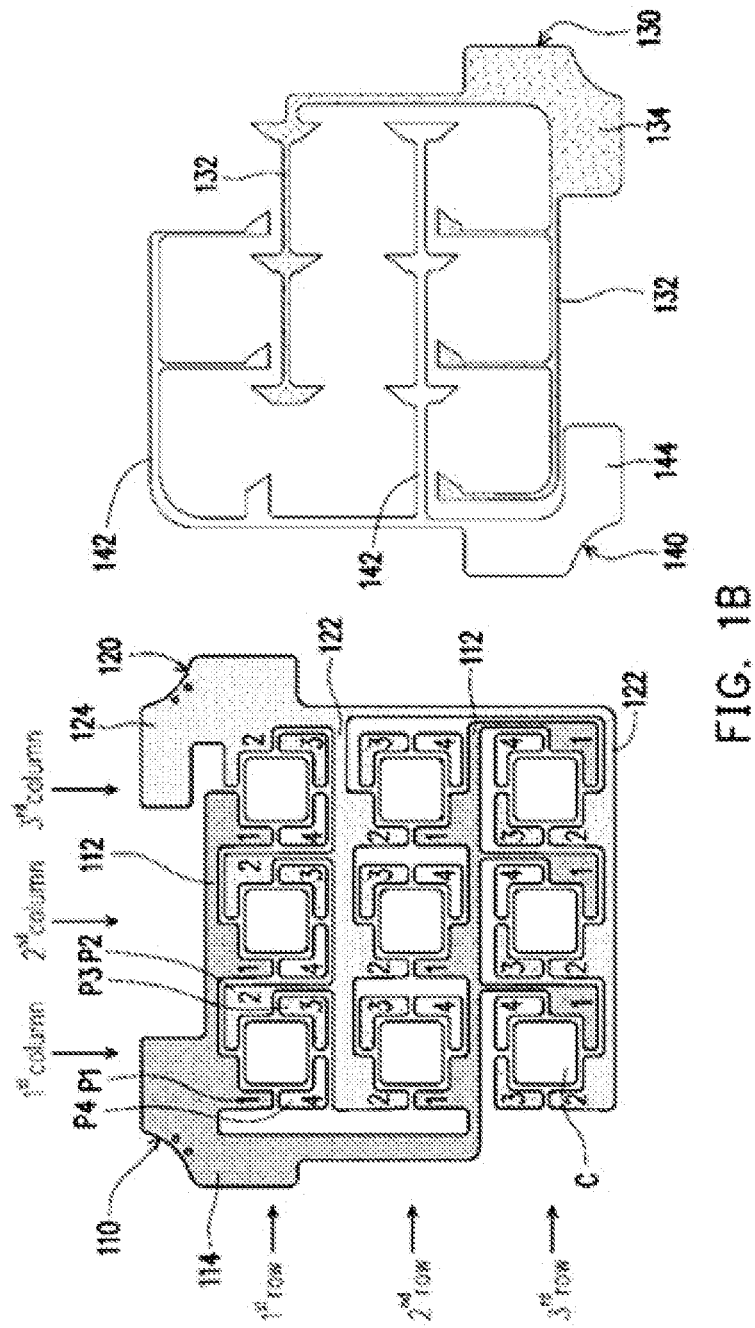
FIG. 1B is an exploded view illustrating the circuit structure of the package carrier of FIG. 1A.

FIG. 1A is a schematic view illustrating a circuit structure of a package carrier according to one embodiment of the present disclosure. FIG. 1B is an exploded view illustrating the circuit structure of the package carrier of FIG. 1A.

Referring to FIG. 1A and FIG. 1B simultaneously, a circuit structure 100 of a package carrier S of the present embodiment is suitable for carrying a plurality of wire bonding LED chips (not shown). The circuit structure 100 includes a plurality of chip pads C, a first bonding pad P1, a second bonding pad P2, a third bonding pad P3, a fourth bonding pad P4, a first electrode 110, a second electrode 120, a third electrode 130, and a fourth electrode 140. The chip pads C are arranged in an M×N array for disposing the LED chips, the M and N are positive integers greater than 1. For convenience of illustration, a 3×3 array formed by nine chip pads C is used for the purpose of illustration in the present embodiment, which, however, is not intended to limit the number of chip pads C and the values of M and N of the present disclosure.

The first bonding pad P1, the second bonding pad P2, the third bonding pad P3, and the fourth bonding pad P4 are sequentially arranged in a peripheral area of each chip pad C.

Orientations of each of the first to fourth bonding pads in the Sth row are different respectively from the first to fourth bonding pads in the (S−1)th and the (S+1)th row by a quadrant (90 degrees), wherein S is a positive integer in the range of 2~N. In the present embodiment, the orientation of each bonding pad P is, for example, the orientation of each bonding pad P in relation to a center of the chip pad C corresponding to the bonding pad P.

In the present embodiment, when S is 2, the orientations of each of the first to fourth bonding pads P1~P4 in the Sth row are different respectively from the orientations of each of the first to fourth bonding pads P1~P4 in the (S−1)th row by a quadrant (90 degrees). For example, the orientations of each of the first to fourth bonding pads P1~P4 in the Sth row are different respectively from the orientations of each of the first to fourth bonding pads P1~P4 in the (S−1)th row by 90 degrees in the counterclockwise direction. The orientations of each of the first to fourth bonding pads P1~P4 in the (S+1)th row are different respectively from the orientations of each of the first to fourth bonding pads P1~P4 in the S row by 90 degrees in the counterclockwise direction. In other words, the orientations of each of the first to fourth bonding pads P1~P4 in the (S−1)th row rotated by 90 degrees in the counterclockwise direction are equal to the orientations of each of the first to fourth bonding pads P1~P4 in the Sth row. The orientations of each of the first to fourth bonding pads P1~P4 in the Sth row rotated by 90 degrees in the counterclockwise direction are equal to the orientations of each of the first to fourth bonding pads P1~P4 in the (S+1)th row. Certainly, in other embodiments, the orientations of each of the first to fourth bonding pads P1~P4 in the Sth row and the (S+1)th row may be different respectively from the orientations of each of the first to fourth bonding pads P1~P4 in the (S−1)th row and the Sth row by 90 degrees in the clockwise direction.

Referring to FIG. 1A and FIG. 1B again, in order for the M first bonding pads P1 in the 1st~Nth rows to connect to the first electrode 110, the first electrode 110 may have a plurality of first branch lines 112 through which the first electrode 110 is respectively connected to the M first bonding pads P1 in the 1st~Nth rows. Similarly, the second electrode 120 has a plurality of second branch lines 122 through which the second electrode 120 is respectively connected to the M second bonding pads P2 in the 1st~Nth rows. The third electrode 130 has a plurality of third branch lines 132 through which the third electrode 130 is respectively connected to the M third bonding pads P3 in the 1st~Nth rows. The fourth electrode 140 has a plurality of fourth branch lines 142 through which the fourth electrode 140 is respectively connected to the M fourth bonding pads P4 in the 1st~Nth rows.

In addition, in the present embodiment, the first electrode 110 has a first main body portion 114, the second electrode 120 has a second main body portion 124, the third electrode 130 has a third main body portion 134, and the fourth electrode 140 has a fourth main body portion 144. Moreover, the first main body portion 114, the second main body portion 124, the third main body portion 134, and the fourth main body portion 144 are, for example, sequentially arranged in a clockwise direction in the peripheral area of the M×N array formed by the plurality of chip pads C.

In one embodiment of the present disclosure, the first branch lines 112 may extend from the first main body portion 114 to the right and are connected sequentially to the M first bonding pads P1 of the 1st~Nth rows. In one embodiment of the present disclosure, the second branch lines 122 may extend from the second main body portion 124 to the left and are connected sequentially to the M second bonding pads P2 of the 1st~Nth rows. From the above illustration, the first branch lines 112 and the second branch lines 122 are alternately arranged but are not connected.

In one embodiment of the present disclosure, the third branch lines 132 may extend from the third main body portion 134 to the left and are connected sequentially to the M third bonding pads P3 of the 1st~Nth rows. The fourth branch lines 142 may extend from the fourth main body portion 144 to the right and are connected sequentially to the M fourth bonding pads P4 of the 1st~Nth rows. From the above illustration, the third branch lines 132 and the fourth branch lines 142 are alternately arranged but are not connected. It should be noted that the afore-mentioned arrangement of the first to fourth branch lines 112, 122, 132, and 142 is one embodiment of the present disclosure and is not intended to limit the scope of the present disclosure. Persons skilled in the art may make modification and variation thereto without departing from the scope of the present disclosure.

A detailed illustration on a multi-chip package having the circuit structure 100 is given below.

Figure 2:
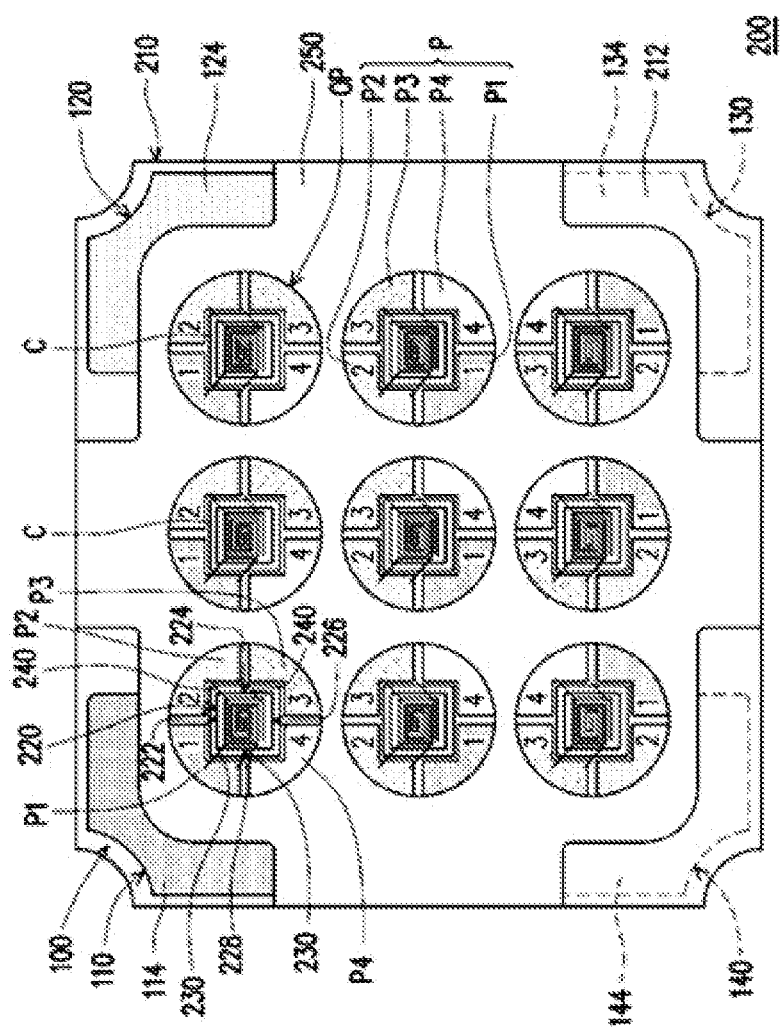
FIG. 2 is a schematic view illustrating a multi-chip package according to one embodiment of the present disclosure.

FIG. 2 is a schematic view of a multi-chip package according to one embodiment of the present disclosure. Referring to FIG. 1A, FIG. 1B, and FIG. 2, a multi-chip package 200 of the present embodiment includes a substrate 210, a plurality of chip pads C, a plurality of LED chips 220, a first electrode 110, a second electrode 120, a third electrode 130, and a fourth electrode 140, wherein the chip pads C and the first to fourth electrodes 110, 120, 130, and 140 form the circuit structure 100.

Simultaneously referring to FIG. 1A, FIG. 1B, and FIG. 2, in the present embodiment, to insulate among the first electrode 110, the second electrode 120, the third electrode 130, and the fourth electrode 140, the substrate 210 has an insulation layer 212, and the first electrode 110, the second electrode 120, and the first to fourth bonding pads P1~P4 are all disposed on the insulation layer 212.

The third electrode 130 and the fourth electrode 140 are both disposed under the insulation layer 212 and pass through the insulation layer 212 to respectively connect to the third bonding pad P3 and the fourth bonding pad P4. In FIG. 1A, since the third electrode 130 and the fourth electrode 140 are both disposed under the insulation layer 212, the third electrode 130 and the fourth electrode 140 are illustrated with dotted lines. The third electrode 130 and the fourth electrode 140 respectively connect to the third bonding pad P3 and the fourth bonding pad P4 via a plurality of through holes (not shown) passing through the insulation layer 212. Certainly, in other embodiments, the first electrode 110, the second electrode 120, the third electrode 130, and the fourth electrode 140, and the first to fourth bonding pads P1~P4 may all be disposed on a same plane via other circuit layouts.

Each of the LED chips 220 is disposed on one of the chip pads C. Each LED chip 220 is electrically connected to two of the bonding pads P on a same side of each LED chip 220, wherein the two bonding pads P are selected from the first bonding pad P1, the second bonding pad P2, the third bonding pad P3, and the fourth bonding pad P4. For example, the multi-chip package 200 may include a plurality of first conductive lines 230 and a plurality of second conductive lines 240, wherein each of the first conductive lines 230 and each of the second conductive lines 240 are respectively electrically connected to each LED chip 220 and two of the bonding pads P on a same side of each LED chip 220. As such, the LED chips 220 are electrically connected in series-parallel, wherein the LED chips 220 in a same row are connected in parallel and the LED chips 220 in adjacent rows are connected in series.

In the present embodiment, each LED chip 220 has the first conductive lines 230 and the second conductive lines 240 in pairs. It is illustrated in FIG. 2 that the first conductive lines 230 in each pair and the second conductive lines 240 in each pair are respectively electrically connected to each LED chip 220 and two of the bonding pads P on a same side 222 of each LED chip 220. In other words, the first conductive lines 230 in pair are electrically connected to the LED chip 220 and one of the bonding pads P on the side 222 of the LED chip 220 and the second conductive lines 240 in pair are electrically connected to the LED chip 220 and the other of the bonding pads P on the same side 222 of the LED chip 220.

It should be noted that in the present embodiment, each of the LED chips 220 has four sides 222, 224, 226, and 228. The first conductive lines 230 in each pair and the second conductive lines 240 in each pair may respectively be electrically connected to two bonding pads P on any side of each LED chip 220. Each pair of the first conducive lines 230 and each pair of the second conductive lines 240 are respectively electrically connected to two bonding pads P on a same side of each LED chip 220.

Compared to the conventional technology, in the present embodiment, the orientations of each of the first to fourth bonding pads P1~P4 in the Sth row of the circuit structure 100 differ respectively with the orientations of each of the first to fourth bonding pads P1~P4 in the (S−1)th row by 90 degrees. Therefore, the first conductive line 230 and the second conductive line 240 may respectively be electrically connected to two of the bonding pads P on a same side of each LED chip 220. As such, in the present disclosure, the direction of wire bonding does not need to be changed when fabricating the first conductive lines 230 and the second conductive lines 240. In light of the above, when fabricating the multi-chip package 200 of the present embodiment, the speed and yield of the wire bonding process are improved and thus productivity is promoted and cost is decreased.

In addition, in the present embodiment, the multi-chip package 200 further includes a coating layer 250 disposed on the insulation layer 212 and covering the first to fourth electrodes 110, 120, 130, and 140 and the first to fourth bonding pads P1~P4 to protect the first to fourth electrodes 110, 120, 130, and 140 and the first to fourth bonding pads P1~P4. The coating layer 250 has a plurality of openings OP to expose the LED chips 220 and portions of the first to fourth bonding pads P1~P4 in the peripheral area of each LED chip 220, wherein the portions of the first to fourth bonding pads P1~P4 are adjacent to each LED chip 220. A material of the coating layer 250 includes insulating materials such as resin.

In summary, the orientations of each of the first to fourth bonding pads in the Sth row of the circuit structure of the present disclosure are different from the orientations of each of the first to fourth bonding pads in the (S−1)th row by 90 degrees. Therefore, the first conductive line and the second conductive line may respectively be electrically connected to two bonding pads on a same side of each LED chip. As such, in the present disclosure, the direction of wire bonding does not need to be changed when fabricating the first or second conductive lines. In light of the above, when fabricating the multi-chip package of the present disclosure, the speed and yield of the wire bonding process are improved and thus productivity is promoted and cost is decreased.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A circuit structure of a package carrier that carries a plurality of wire bonding light emitting diode (LED) chips, the circuit structure comprising:
   a plurality of chip pads arranged in an array of M columns and N rows to dispose the LED chips, M and N each being a positive integer greater than 1;
   for each of the chip pads:
      a respective first bonding pad, a respective second bonding pad, and a respective third bonding pad that are electrically insulated from each other and sequentially arranged in a peripheral area of the respective chip pad, a first orientation of the respective first, second, and third bonding pads in a first row of the N rows differing from a second orientation of the respective first, second, and third bonding pads in a second row of the N rows by 90 degrees, the respective first, second, and third bonding pads being different from each other; and
   a first electrode, a second electrode, and a third electrode:
      the first electrode comprising a plurality of first branch lines connected to the respective M first bonding pads in each of the N rows;
      the second electrode comprising a plurality of second branch lines connected to the respective M second bonding pads in each of the N rows; and
      a third electrode comprising a plurality of third branch lines connected to the respective M third bonding pads in each of the N rows.

2. The circuit structure according to claim 1, wherein the first branch lines and the second branch lines are alternately arranged.

3. The circuit structure according to claim 1, further comprising:
   for each of the chip pads:
      a respective fourth bonding pad that is electrically insulated from the respective first, second, and third bonding pads, a fourth orientation of the respective first, second, third, and fourth bonding pads in a first row of the N rows differing from a fifth orientation of the respective first, second, third, and fourth bonding pads in a second row of the N rows by 90 degrees; and
   a fourth electrode comprising a plurality of fourth branch lines connected to the respective M fourth bonding pads in each of the N rows.

4. The circuit structure according to claim 1, wherein the second orientation differs from the first orientation by 90 degrees counterclockwise.

5. The circuit structure according to claim 4, wherein a third orientation of the respective first, second, and third bonding pads in a third row of the N rows differs from the second orientation by 90 degrees counterclockwise, the second row being between the first row and the third row.

6. The circuit structure according to claim 1, wherein the first electrode has a first main body portion, the second electrode has a second main body portion, and the third electrode has a third main body portion, and wherein the first, second, and third main body portions are sequentially arranged in a peripheral area of the array of the chip pads.

7. The circuit structure according to claim 6, wherein the first main body portion is connected to the respective M first bonding pads in each of the N rows via the first branch lines.

8. The circuit structure according to claim 6, wherein the second main body portion is connected to the respective M second bonding pads in each of the N rows via the second branch lines.

9. The circuit structure according to claim 6, wherein the third main body portion is connected to the respective M third bonding pads in each of the N rows via the third branch lines.

10. A multi-chip package, comprising:
   a plurality of chip pads arranged in an M×N array, M and N each being a positive integer greater than 1, a peripheral area of each of the chip pads comprising a respective first bonding pad, a respective second bonding pad, and a respective third bonding pad arranged in sequence in a clockwise direction, a first orientation of the respective first, second, and third bonding pads in a first row of the N rows differing from a second orientation of the respective first, second, and third bonding pads in a second row of the N rows by 90 degrees; and
   a plurality of light emitting diode (LED) chips, each LED chip disposed on a respective one of the chip pads and electrically connected to two of the respective first, second, and third bonding pads on a same side of the respective LED chip.

11. The multi-chip package according to claim 10, further comprising:
   a first electrode comprising a plurality of first branch lines connected to the respective M first bonding pads in each of the N rows;
   a second electrode comprising a plurality of second branch lines connected to the respective M second bonding pads in each of the N rows; and
   a third electrode comprising a plurality of third branch lines connected to the respective M third bonding pads in each of the N rows.

12. The multi-chip package according to claim 11, wherein the first electrode has a first main body portion, the second electrode has a second main body portion, and the third electrode has a third main body portion, and wherein the first, second, and third main body portions are sequentially arranged in a peripheral area of the array of the chip pads.

13. The multi-chip package according to claim 10, further comprising:
   a substrate on which the chip pads are disposed.

14. The multi-chip package according to claim 13, wherein the substrate includes an insulation layer, wherein the first electrode, the second electrode, and the first, second, and third bonding pads are disposed on the insulation layer, and wherein the third electrode is disposed under the insulation layer and passes through the insulation layer to connect to the third bonding pad.

15. The multi-chip package according to claim 14, further comprising:
   a plurality of first conductive lines and a plurality of second conductive lines, each of the first conductive lines and each of the second conductive lines electrically connected to a respective one of the LED chips and two of the respective first, second, and third bonding pads on a same side of the respective one of the LED chips.

16. The multi-chip package according to claim 15, wherein the first conductive lines in each pair and the second conductive lines in each pair are respectively electrically connected to the respective one of the LED chips and two of the bonding pads on a same side of each LED chip.

17. The multi-chip package according to claim 14, further comprising:
   a coating layer disposed on the insulation layer and covering the first, second, and third bonding pads, the coating layer having a plurality of openings that expose the LED chips and portions of the first, second, and third bonding pads in the peripheral area of each LED chip, the portions of the first, second, and third bonding pads being adjacent to each LED chip.

18. The multi-chip package according to claim 17, wherein the coating layer comprises resin.

19. The multi-chip package according to claim 10, wherein the second orientation differs from the first orientation by 90 degrees counterclockwise, and wherein a third orientation of the respective first, second, and third bonding pads in a third row of the N rows differs from the second orientation by 90 degrees counterclockwise, the second row being between the first row and the third row.

20. The multi-chip package according to claim 11, further comprising:
   a fourth electrode comprising a plurality of fourth branch lines connected to the respective M fourth bonding pads in each of the N rows, and
   wherein the peripheral area of each of the chip pads further comprises:
      a respective fourth bonding pad that is electrically insulated from the respective first, second, and third bonding pads, a fourth orientation of the respective first, second, third, and fourth bonding pads in a first row of the N rows differing from a fifth orientation of the respective first, second, third, and fourth bonding pads in a second row of the N rows by 90 degrees.

* * * * *